(12) United States Patent
Leich et al.

(10) Patent No.: US 6,653,903 B2
(45) Date of Patent: Nov. 25, 2003

(54) SUPPLY VOLTAGE DECOUPLING DEVICE FOR HF AMPLIFIER CIRCUITS

(75) Inventors: Martin Leich, Freiburg (DE); Michael Schlectweg, Freiburg (DE)

(73) Assignee: Fraunhofer Gesellschaft zur Förderung der angewandten Forschung e.V., München (DE)

( * ) Notice: Subject to any disclaimer, the term of this patent is extended or adjusted under 35 U.S.C. 154(b) by 0 days.

(21) Appl. No.: 09/910,800

(22) Filed: Jul. 24, 2001

(65) Prior Publication Data

US 2002/0014922 A1 Feb. 7, 2002

(30) Foreign Application Priority Data

Jul. 25, 2000 (DE) .......................... 100 36 127

(51) Int. Cl.[7] ................................ H03F 3/04
(52) U.S. Cl. .................. 330/297; 330/277; 330/286
(58) Field of Search .................. 330/277, 297, 330/286, 54

(56) References Cited

U.S. PATENT DOCUMENTS

| | | | | | |
|---|---|---|---|---|---|
| 4,486,719 A | * | 12/1984 | Ayasli | ....................... | 330/277 |
| 4,543,535 A | * | 9/1985 | Ayasli | ....................... | 330/277 |
| 4,733,195 A | * | 3/1988 | Tserng et al. | .................. | 330/54 |
| 4,754,234 A | * | 6/1988 | Gamand | ..................... | 330/286 |
| 4,788,511 A | * | 11/1988 | Schindler | ..................... | 330/277 |
| 5,874,859 A | | 2/1999 | Amachi et al. | ............. | 330/277 |

\* cited by examiner

Primary Examiner—Tuan T. Lam
(74) Attorney, Agent, or Firm—Breiner & Breiner, L.L.C.

(57) ABSTRACT

A device for decoupling a supply voltage for HF amplifier circuits is described which includes an output line for coupling out an amplified signal, wherein one end of the output line, which is not used for coupling out signals, is connected to a circuit element designed as decoupling circuit. The circuit element has a low ohmic d.c. resistance and presents an HF-power absorption capacity that increases as the frequency increases, thus constituting a reflection-free termination for high frequencies. The circuit element is preferably constituted by several discrete subcircuits connected in succession. The device permits the operation of integrated distributed amplifiers of high performance at a low power loss caused by the decoupling circuit.

6 Claims, 8 Drawing Sheets

SUPPLY VOLTAGE DECOUPLING DEVICE FOR HF AMPLIFIER CIRCUITS

The present invention relates to a supply voltage decoupling device for HF amplifier circuits, comprising an output line for the output of an amplified signal, wherein one end of the output line, which is not used for signal output, is connected to a circuit element designed as decoupling circuit.

The device is provided in particular for very broad band distributed amplifiers, such as those employed in the optical communication technology. For the utilisation of its high potential in terms of transmission bandwidth, the optical communication technology requires electronic amplifier circuits capable of coping even with waves in the millimeter range while starting out from frequencies in the audible range. This requires a bandwidth in amplification that ranges from a few kHz up to a few tens of GHz.

For the operation of the employed amplifier circuits decoupling of the DC voltage from the signal-carrying part of the circuit is necessary, specifically in the manner provided by the present inventive device.

PRIOR ART

Many amplifier circuits for optical communication technology are presently designed in a monolithic structure. In amplifiers of such a type the supply voltage is decoupled from the amplifiers via decoupling circuits composed of capacitors, coils and resistors. There, the resistor is connected in series with the coil, as may be seen, for example, from the illustration in the data sheet "Monolithic Amplifiers" of the company of Mini-Circuits®. In the case of very low amplifier outputs this is generally not problematic because the losses occurring on the resistor, due to the direct voltage component of the supply voltage, create only small thermal outputs that can be easily carried off without major expenditure.

However, this concept cannot be employed in the case of higher power input levels, particularly when integrated amplifiers are used that are designed for higher output levels, because in such a case a substantial additional thermal output is produced in a minimum of space and must be carried off under the aggravated spatial situation. The application of a major number of such components in respective installations moreover entails a noticeable additional expenditure at the system level.

As a rule, specific separate decoupling circuits in a hybrid circuitry design are used in the case of amplifiers for higher power demands, which are composed of discrete inductors and capacitors. Such separate decoupler circuits are, however, very expensive and require a space much greater than that common for integrated systems. One example of such a decoupling circuit can be seen in the data sheet of SHFdesign®, which relates to the unit "Wideband Bias-T SHF 122". The precise details of the circuitry in such systems are not known, however. Apart from the substantial dimensions, such decoupling circuits must be directly connected in the signal path so that additional attenuation and distortion of the signal must be expected.

Moreover, the following circuits are known in relation to the supply of supply voltage to amplifiers.

The German Patent DE 3117009 discloses a filter network constituted by two inductors as well as two capacitors. This filter network does not allow the flow of a high-frequency current from the drain electrode of the transistor to the source of supply voltage. In the case of application in a distributed amplifier—rather than the inventive device—the filter network would not absorb high-frequency currents without reflection but rather reflect these currents, thus impairing the output reflection factor of the amplifier as well as the flat development of amplification towards values that are not useful.

The German Patent DE 19534382 presents a method employed for amplifiers having a bandwidth other than an ultra-wide bandwidth for supplying supply voltages by means of high-frequency lines having the length of a quarter of the wavelength approximately at the operating frequency. One special feature in this case is the reduction of the necessary length of the line by means of an inductor. This method does, as a matter of fact, not operate properly in the case of a distributed amplifier having an ultra-wide bandwidth, because the substitution of the inventive device by this method results, in its turn, in undesirable reflection. Even the operation in parallel with a suitable terminating resistor results in a restriction of he useful frequency range in a direction away from the very low frequencies that are equally relevant in terms of transmission technology.

The German Patent DE 19752216 discloses circuits for the DC power supply in amplifiers, which are essentially composed of inductors, resistors as well as capacitors. In these circuits a DC current flows through the resistor R2, which, in the case of a power amplifier, gives rise to inexpedient effects with respect to the efficiency and the heat produced. If the value of R2 disappears a low-pass filter is formed by C2, C4 as well as Ls2, whose application—instead of the inventive device—gives rise to the same negative effects as those described already with reference to the German Patent DE 19534382.

The U.S. Pat. No. 5,349,306 discloses the supply of DC current into the drain line of a distributed amplifier, with the drain voltage Vdd being passed via a capacitor through a coil that is part of a band-pass network combining the drains of the FETs. In this manner, a point in the band-pass network, which is cold in terms of high frequencies, is skilfully utilised for coupling in a DC current. However, a band-pass requires a high lower cutoff frequency. The prerequisite for a distributed amplifier with the lowermost lower cutoff frequency, by contrast, is the application of a low-pass filter network that does not involve this possibility of DC voltage supply.

It is an object of the present invention to provide a device for supply voltage decoupling for HF amplifier circuits, which is suitable for elevated amplification outputs and which can be implemented at low costs. The device should particularly permit the power supply of integrated distributed amplifiers designed for elevated outputs at a low power loss caused by the decoupling circuit.

BRIEF DESCRIPTION OF THE INVENTION

This object is achieved with a device of the type defined in patent claims 1, 6, 7, 8 and 9. Expedient embodiments of the device are subject of the dependent claims.

The devices comprise an output line connected to the HF amplifiers for coupling out an amplified signal, wherein one end of the output line, which is not used for coupling out the signals, is connected to a circuit element designed as a decoupling circuit. In distinction from the known decoupling circuits according to prior art, the present circuit element does not present any non parasitic ohmic resistance for DC power. The parasitic ohmic resistance of the circuit element is therefore small—compared against the line impedance of the output line so that, with a line impedance of 50 Ω, it will not essentially exceed a value of 5 Ω in the most inexpedient case. The avoidance of a parasitic resistance is preferably the aim. The circuit element is moreover designed in such a way that it produces an HF power absorption increasing as the frequency increases, and constitutes a reflection-free load for high frequencies.

The supply voltage is supplied to the HF amplifier or amplifiers via this circuit element. Due to the low ohmic resistance of the circuit element the power loss due to the applied supply voltage is only small. The demands in terms of provisions for carrying off the heat can therefore still be managed without any problems, even in the case of elevated power levels. The absorption of the circuit element, which is reduced as the frequency increases, as well as its function as reflection-free high-frequency load permit the trouble-free coupling-out of the amplified signal at the other end of the output line.

In a preferred and very expedient embodiment of the present device, the circuit element consists of several subcircuits operated in a cascade, whereof each consists of an inductor on a first part of the line as well as of a capacitor and a terminating resistor on a second line segment. The second line segment here branches off the first line segment and is connected to the ground whilst the first line segment of a subcircuit is respectively connected to the first line segment of the subcircuit joining it in the cascade. In this manner, a series circuit of inductors is created between which the respective second line segment with the capacitor and the terminating resistor is branched off.

This catenary arrangement of subcircuits as the present circuit element is connected to that end of the output line of the preferably distributed amplifier, which is not used for carrying off the amplified signal, instead of the terminating resistor required in usual designs. In a particularly expedient improvement of the device, the power outputs of higher frequencies are isolated and absorbed by a first number of subcircuits operated in a cascade whilst the remaining power outputs at comparatively low frequencies are absorbed by similar circuits that are, however, joined to the chip, i.e. not integrated in the chip, and are differently dimensioned in an appropriate manner.

One essential advantage of the present device mainly consists in the fact that the generation of thermal power by means of the d.c. current to be supplied to the amplifiers is avoided. As on that end of the output line of the preferably distributed amplifier, which is not used to carry off the amplified signal, a substantial fraction of the signal power appears only at comparatively low frequencies it is possible that the first elements of the catenary arrangement of subcircuits, which isolate signal components of higher frequencies, are implemented on the amplifier chip because in such a case they produce only a small power loss. Higher power losses are created in the subcircuits joined to the chip, which, due to the small residual bandwidth of the signal to be decoupled from the supply current, can be implemented at a comparatively low expenditure and hence at low costs. On the other hand, the first subcircuits for the absorption of the highest frequency components are integrated into the amplifier chip and can hence be equally implemented at low costs.

In this case the first subcircuits are designed to present a lower absolute value of the induction and hence a higher cutoff frequency as well as a higher self-resonant frequency of the inductor than the following subcircuits. The inductance preferably increases and the cutoff frequency of each subcircuit as well as the self-resonant frequency of the inductance of each subcircuit decreases as the number of subcircuits connected already to the output line increases.

In addition to the preferred embodiment with individual discrete subcircuits, the present circuit element may also be implemented in a different manner. The entirety of all subdevices may be considered to be a dissipative catenary conductor (ladder network). Its infinitesimal correspondence is a dissipative high-frequency line that may be equally used as circuit element at the end of the output line with the characteristics described here. Moreover, dissipative lines involving an insulating attenuating material may be implemented and employed with the specified characteristics. Further examples of circuit elements that may be designed in correspondence with the specified requirements are micro-strip transmission lines with an attached absorber wedge made of ferrite or with a ferrite paste applied thereon. Such systems are also known by the term "micro-wave marsh".

In another embodiment, the circuit element includes optional low-pass filters matched with the effective impedance of the output line or whose effects produce a corrective influence on the amplifier characteristics in transmission.

BRIEF DESCRIPTION OF THE DRAWINGS

The present device will be described again in the following, without any restriction of the general inventive idea, by an embodiment which reveals further features of the inventive device. In the drawing.

WAYS OF CARRYING OUT THE INVENTION

Figure 1:
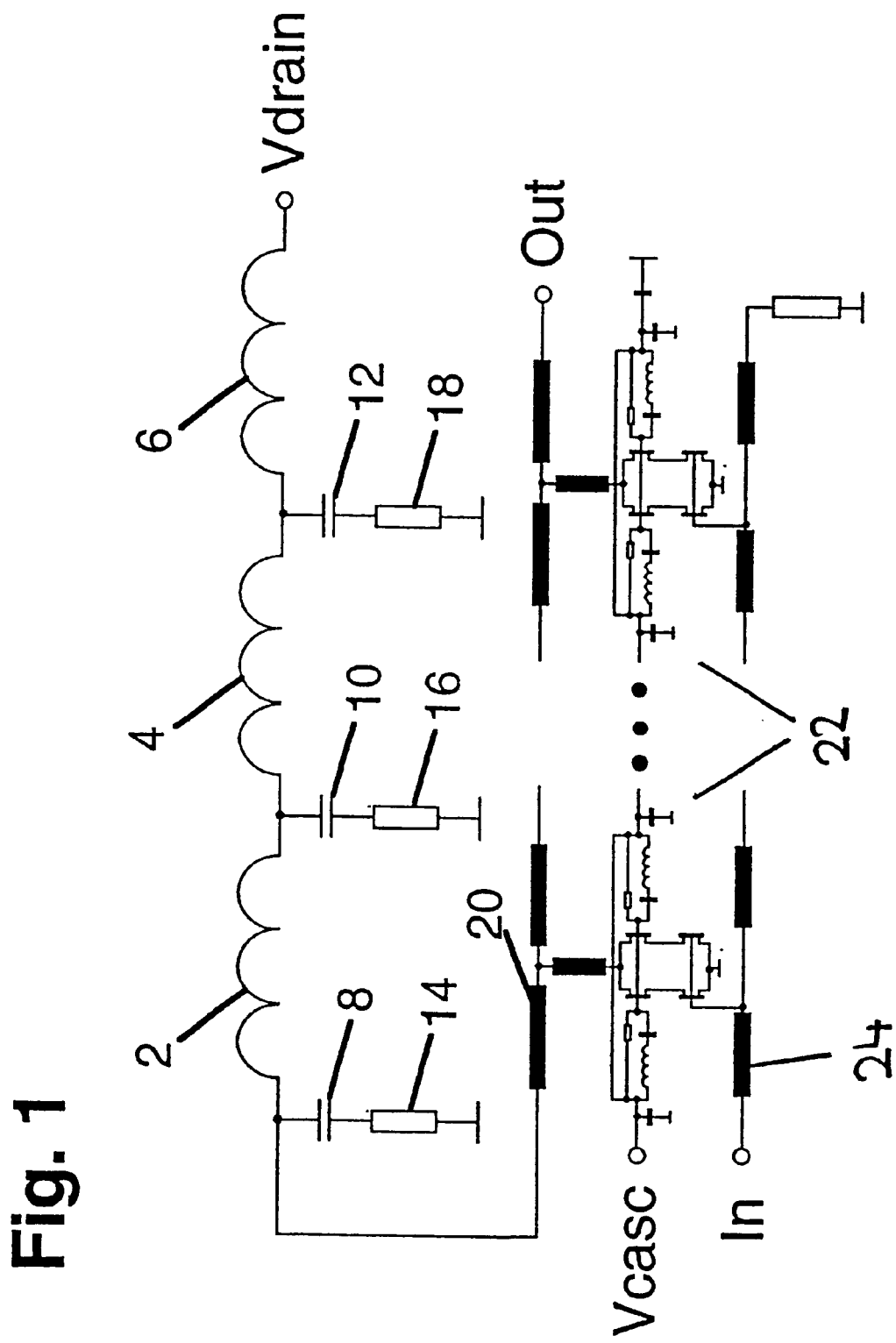
FIG. 1 shows one embodiment of a connection diagram of a distributed amplifier including the present device for decoupling the supply voltage.

FIG. 1 shows one embodiment of a connection diagram of a distributed amplifier and of the present device for decoupling the supply voltage. The illustrated distributed amplifier is described in more details in the publication by M. Leich et al., "40 GBit/s High Voltage Modulator Driver in P-HEMT Technology", in: Electronics Letters, vol. 35, No. 21, pages 1842 to 1844. Such a distributed amplifier may, for instance, be structured in four sections whereof the figure illustrates only two. This amplifier can be realised in a GaAs P-HEMT-technology and offers a high amplification factor over a wide frequency range. As far as details are concerned reference is made to the aforementioned document.

The distributed amplifier 22 is connected to an output line 20 via which the amplified signals are coupled out at one end (Out). The inventive device is connected to the opposite end of the output line 20, which is not envisaged for coupling out the amplified signals. In the present example, the device is composed of three subcircuits including the inductors 2, 4, 6 and the capacitors 8, 10, 12 as well as the terminating resistors 14, 16, 18. A first subcircuit consists of the inductor 2, the capacitor 8 and the terminating resistor 14. The line section including the capacitor 8 and the terminating resistor 14 branches off the line section including the inductor 2 and is connected to ground. A second subcircuit presents a similar structure and consists of the inductor 4, the capacitor 10 and the terminating resistor 16. A third subcircuit is constituted by the inductor 6, the capacitor 12 and the terminating resistor 18. The individual subcircuits are inter connected in such a way that the inductors 2, 4 and 6 are connected in series between the supply voltage $V_{drain}$, which can be connected to the circuit element, and the connecting line 20.

The values of the terminating resistors 14, 16 and 18 correspond to the effective impedance of the output line 20 for absorbing drained high-frequency power via the capacitors 8, 10 and 12 without reflection. To ensure a reflection-free transition from the output line 20 to the first subcircuit, the quotient of the value of the inductor 2 and the value of the capacitor 8 corresponds to the square of the effective impedance of the output line 20. This applies equally to the value of the inductor 4 or 6, respectively, relative to the value of the capacitor 10 or 12. The absolute value of the inductor 2 is limited by the self-resonant frequency that exists in practically implemented embodiments. The magnitude of this frequency must exceed the range of transmission of the distributed amplifier 1 and increases as the values of the inductor 2 decrease.

In order to eliminate also lower frequencies without reflection the inventive device may consist of a large number of subcircuits of the same or a similar time, which are dimensioned in the same manner as the first subcircuit. As a matter of fact, the device is, of course, not limited to the number of three subcircuits described here. The device may rather consist of any number of subcircuits desired.

Compared against a similar dimensioning of all subcircuits, a more efficient mode of operation of the device can be realised by the provision that the individual subcircuits present different absolute values of the inductors 2, 4 and 6. The values of the inductors are so selected that the respective joining subcircuit includes an inductor 4 or 6, respectively, whose respective absolute value is higher than that in the preceding subcircuit while its respective self-resonant frequency is lower than the frequency in the preceding subcircuit. In terms of its interfering effect, the respectively lower self-resonant frequency of the inductor of the respective joining subcircuit is eliminated insofar as corresponding fractions of the frequency spectrum are drained and eliminated by the respective preceding subcircuits.

Figure 2:
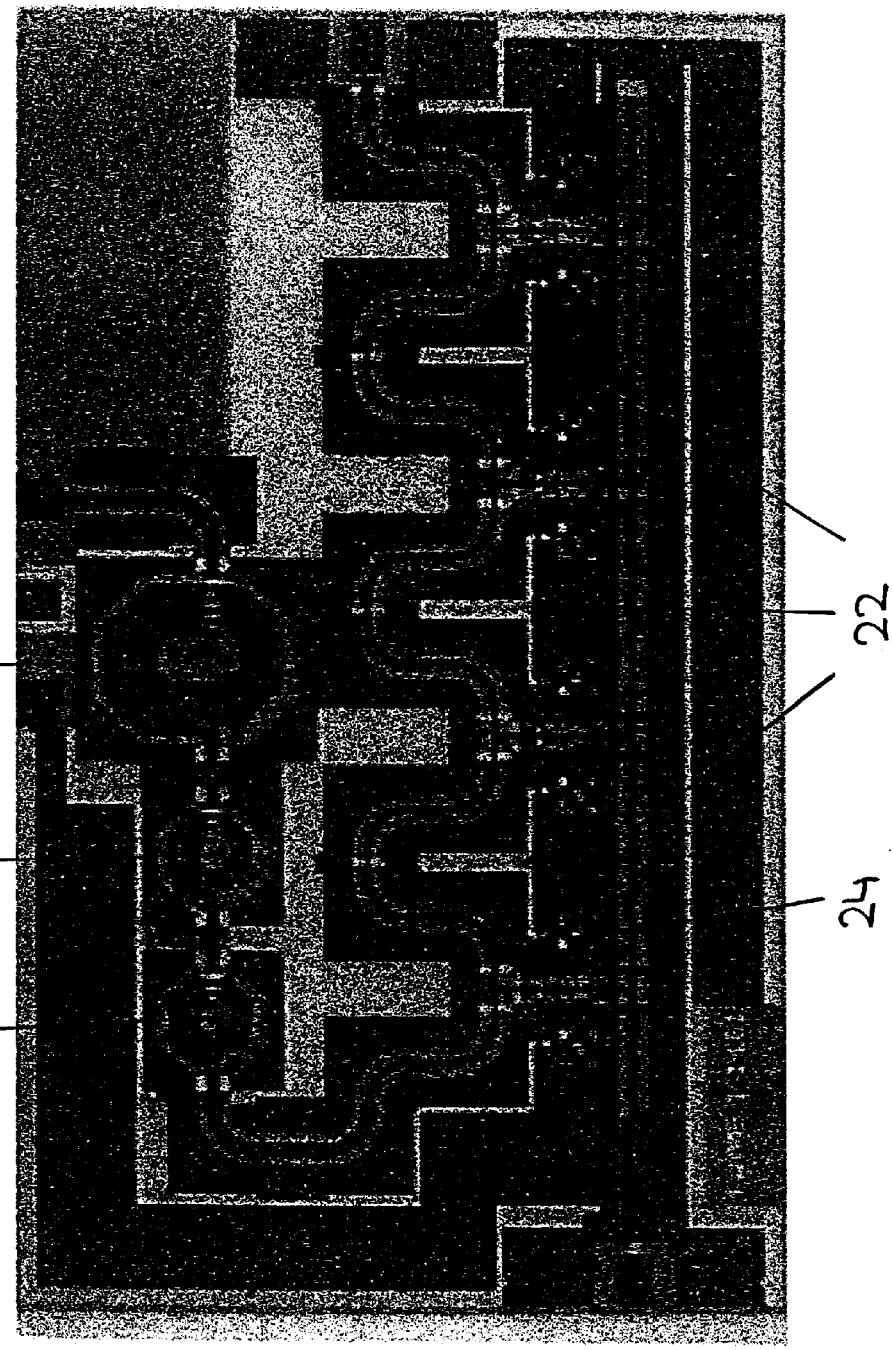
FIG. 2 is a photograph of a chip of a distributed amplifier with an inventive decoupling circuit.
Figure 3:
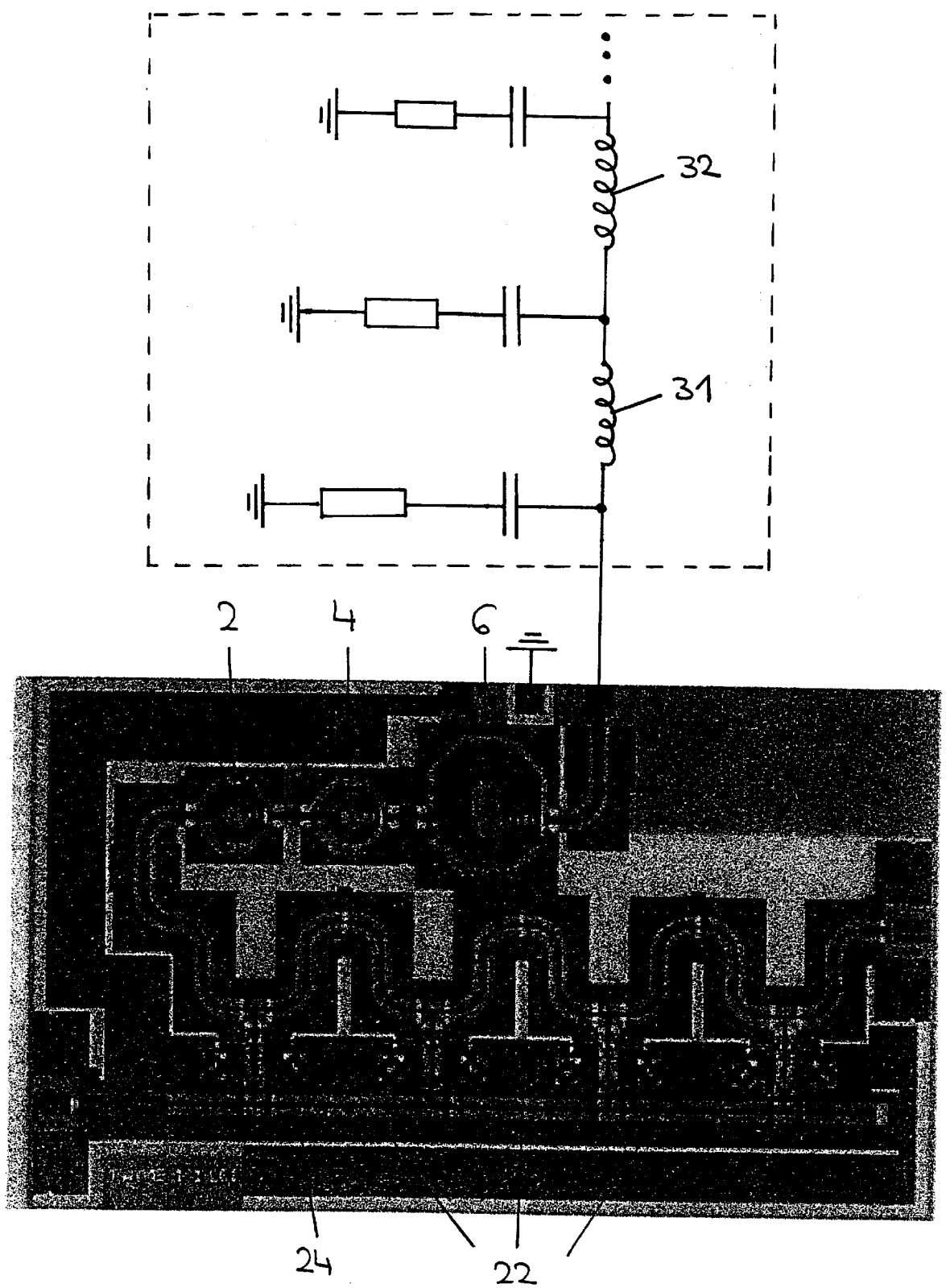
FIG. 3 is a view of a second embodiment of a connection diagram of a distributed amplifier including the present device for decoupling the supply voltage, wherein a first number of the subcircuits with the amplifier circuit is integrated on a chip while the remaining subcircuits are configured independently of the chip.
Figure 4:
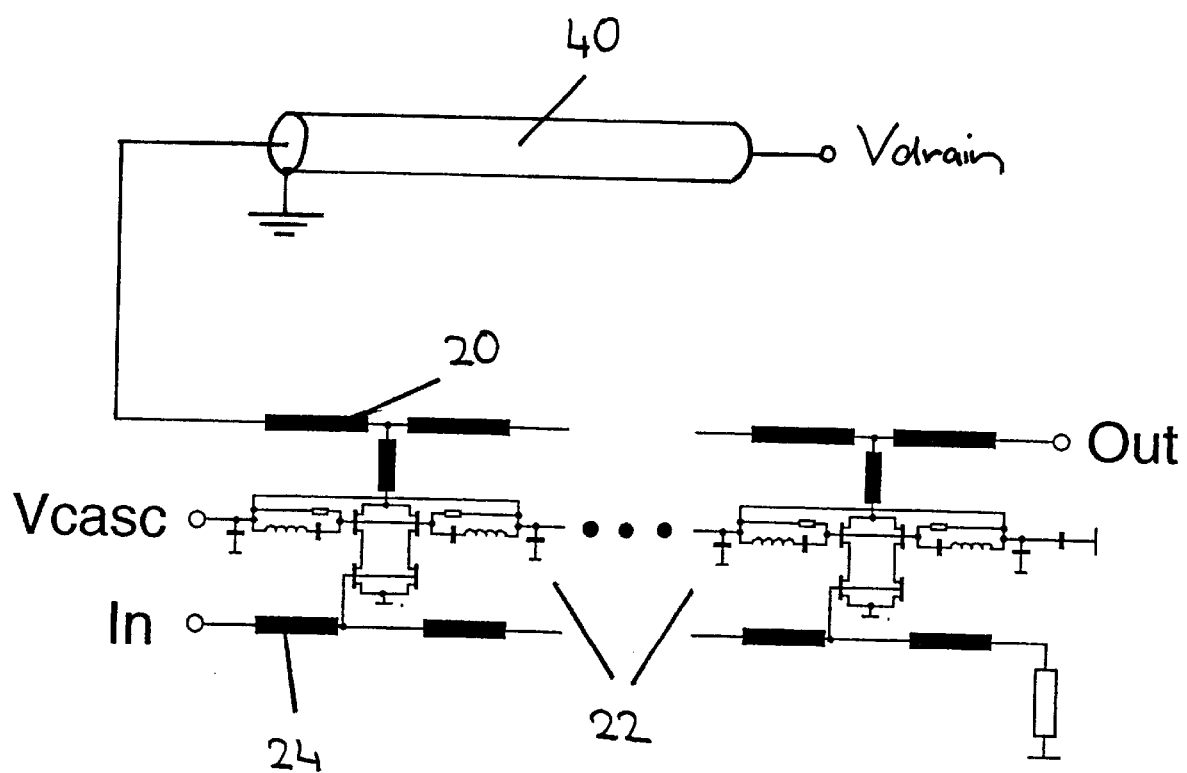
FIG. 4 illustrates a third embodiment of a connection diagram of a distributed amplifier including the present device for decoupling the supply voltage, wherein the circuit element is constituted by a high-frequency line presenting a loss for the high-frequency range.
Figure 5:
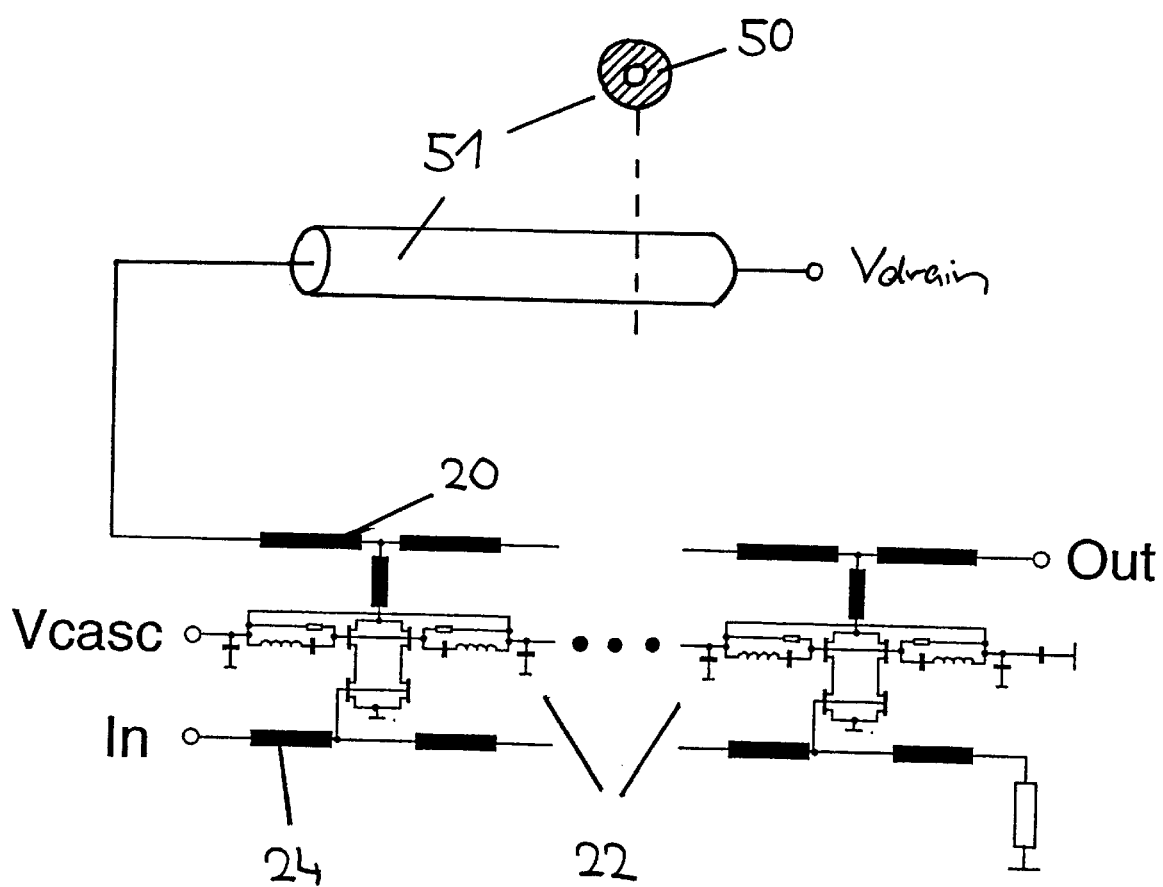
FIG. 5 is a view of a fourth embodiment of a connection diagram of a distributed amplifier including the present device for decoupling the supply voltage, wherein the circuit element is constituted by a line containing a material attenuating high frequencies.
Figure 6:
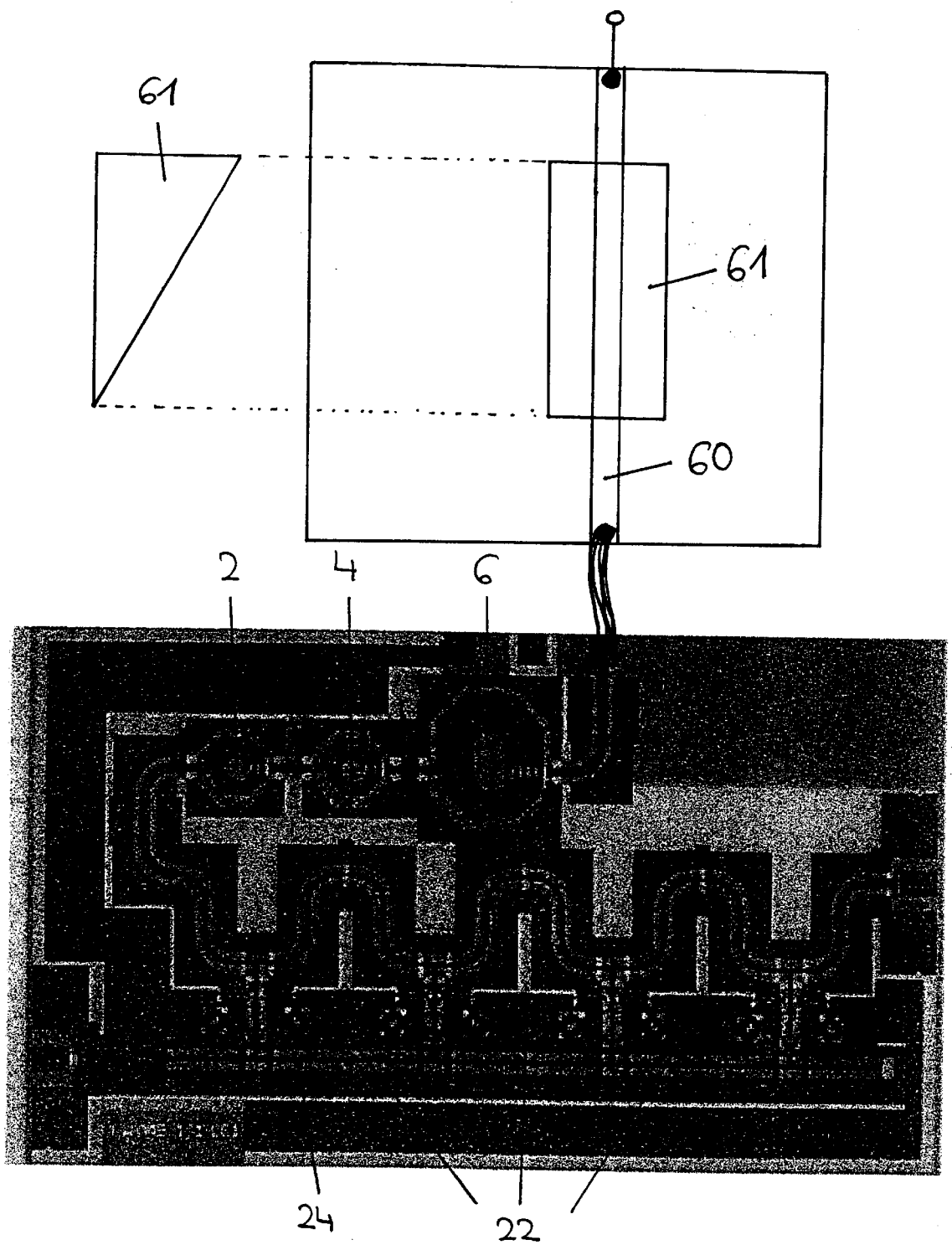
FIG. 6 illustrates a fifth embodiment of a connection diagram of a distributed amplifier including the present device for decoupling the supply voltage, wherein the circuit element is formed by a micro-strip transmission line with an absorber wedge of ferrite attached thereon.
Figure 7:
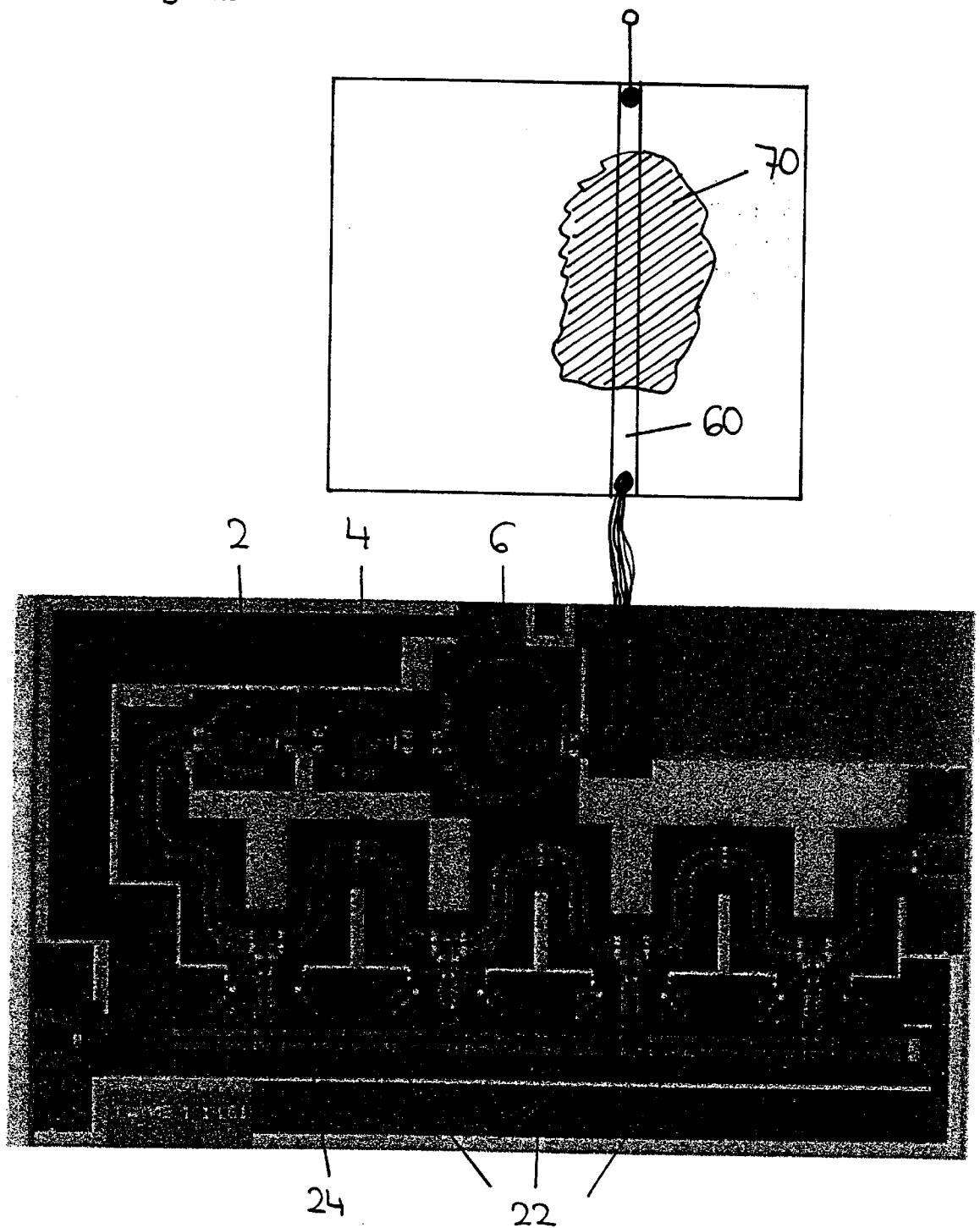
FIG. 7 shows a sixth embodiment of a connection diagram of a distributed amplifier including the present device for decoupling the supply voltage, wherein the circuit element is constituted by a micro-strip transmission line with a ferrite paste applied thereon.

The inventive device can be integrated, at least partly, on the same chip, in particular, on which the distributed amplifiers are located as well. Such an implementation is shown as photograph of a chip in FIG. 2. In that figure the distributed amplifiers 22 on an input line 24 can be recognised. The end of the output line 20, which is not used for signal draining, is connected to three of the present subcircuits, with the inductors 2, 4 and 6 being recognisable in the chip photograph. In the event that lower frequencies are to be absorbed as well the subcircuits used to this end are implemented outside this chip and attached to the chip.

Figure 8:
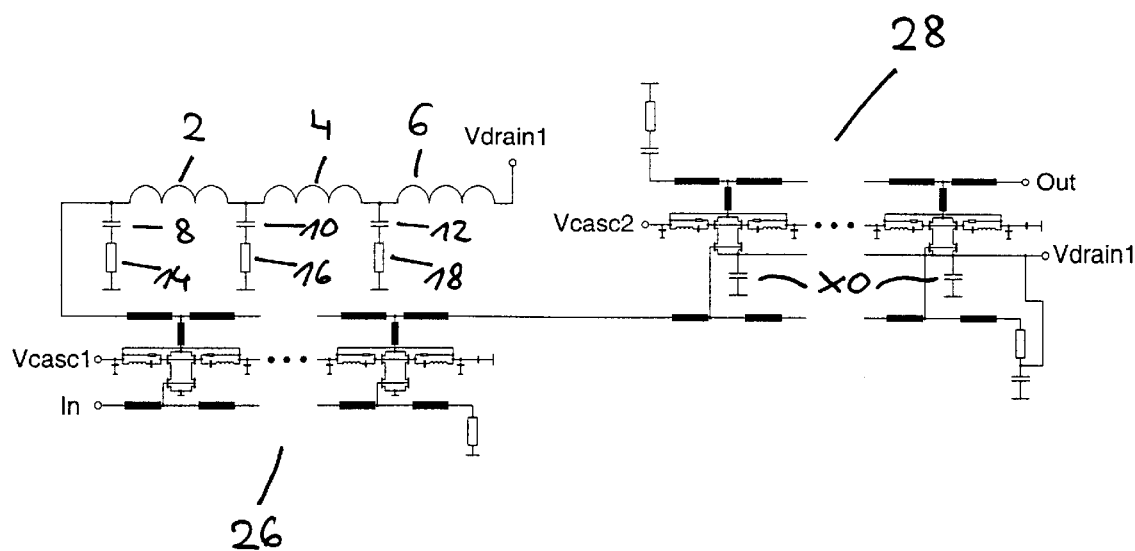
FIG. 8 illustrates a further embodiment showing a two-stage driver composed of distributed amplifiers.

FIG. 8 represents a schematic diagram of a two-stage driver composed of distributed amplifiers 22 with proven high voltage operation at 40 Gbit/s. Molecular beam epitaxy grown QW-PHEMTs with 150 nm T-gates operate in cascode configuration. The figure shows only the first and the last sections of the four-section distributed amplifiers 22. Usual designs also consist of several distributed amplifiers which are capacitively coupled over bias tee configurations. This may be detrimental to very low frequency operation, which is essential for signals ranging down to 8 kHz. Conversely, coupling elements capable of kHz-frequencies, do not have large overall bandwidths, except at very high costs. In each case, distortion of the amplified signal and loss has to be taken into account.

Therefore, the present circuit has a galvanic connection between its two stages 26, 28. This can destroy the final stage 28, in switching the drain voltage of the first stage 26 on the gates of the final amplifier of the device directly, if no measures are taken to prevent large voltages between the gates and the sources of the final stage. In this circuit, compensation is applied to the sources of the final stage transistors, which results in the same value as the drain voltage of the first stage to provide the optimum gate source bias voltage of 0V. Capacitors X0 provide the AC-current flow to ground. The on-chip-capacitors X0 are in parallel connection with larger capacitors outside of the chip to perform operation down to lowest frequencies. The advantage of this solution is in the absence of bulky capacitors on the signal line. A particular problem in this circuit is supplying drain bias voltage to the first stage 26, which cannot be performed using a bias tee between the two stages because of the above reason. A simple inductance also would fail owing to its large value and the resulting low self resonance frequency. Feeding over the load of the backward end of the drain line causes a high heat production on the chip.

The solution is to replace the load of the backward end by a chain of AC shunted decoupling devices with rising values of their inductances 2, 4, 6 and capacitances 8, 10, 12. Outside the chip, very low frequency versions of these decoupling devices are connected with the drain biasing voltage. In our setup, the final stage 28 is fed using a commercially available bias tee that can be replaced by the same biasing circuit as in the first stage in an alternative embodiment.

List of Reference Numerals 2, 4, 6 inductor
8, 10, 12 capacitor
14, 16, 18 terminating resistor
20 output line
22 distributed amplifiers
24 input line
26 first stage
28 second stage

31, 32 inductors of the remaining subcircuits
40 HF line dissipative for high frequencies
50 HF-attenuating material
51 line containing HF-attenuating material
60 micro-strip transmission line
61 absorber wedge
70 ferrite paste
X0 capacitor

What is claimed is:

1. Device for decoupling a supply voltage for HF amplifier circuits, comprising:

an output line for coupling out an amplified signal, which comprises on one end a terminal for coupling out the amplified signal and on the opposite end a terminal for a supply voltage of said HF amplifier circuits, with said HF amplifier circuits being connected to said output line in a connection zone between the two ends, and a circuit element for decoupling the supply voltage, which is provided in the output line between said connection zone for said HF amplifier circuits and the terminal for the supply voltage, which constitutes a reflection-free termination for high frequencies and which presents an HF-power absorption capacity increasing as the frequency increases, wherein said circuit element is constituted by one or several subcircuits operated in a cascade, whereof each consists of an inductor on a first line section as well as a capacitor and a terminating resistor on a second line section, with said second line section branching off said first line section and being connected to ground while said first line section of a subcircuit is connected to the first line section of the subcircuit joining in the cascade, and wherein a quotient of a value of inductance and a value of capacitance of each of said one or several subcircuits corresponds to the square of effective impedance of said output line, and wherein a first number of subcircuits together with said amplifier circuit is integrated on a chip and that the remaining subcircuits are implemented independently of the chip, with the inductors in the remaining subcircuits presenting higher values than the subcircuits of said first number.

2. Device according to claim 1, wherein said individual subcircuits present different values of inductance, with the respective subcircuit joining in the cascade having a higher absolute value of inductance as well as a lower self-resonant frequency of this inductor than the preceding subcircuit.

3. Device according to claim 1, wherein said individual subcircuits present different cutoff frequencies, with the respective subcircuit joining in the cascade having a lower cutoff frequency than the preceding subcircuit.

4. Device according to claim 1, wherein said circuit element comprises a parasitic ohmic resistance which is lower than approximately one fifth of the impedance of said output line.

5. Device according to claim 1, wherein said output line is connected to distributed HF amplifiers.

6. Device for decoupling a supply voltage for HF amplifier circuits, comprising:

an output line for coupling out an amplified signal, which comprises on one end a terminal for coupling out the amplified signal and on the opposite end a terminal for a supply voltage of said HF amplifier circuits, with said HF amplifier circuits being connected to said output line in a connection zone between the two ends, and a circuit element for decoupling the supply voltage, which is provided in the output line between said connection zone for said HF amplifier circuits and the terminal for the supply voltage, which constitutes a reflection-free termination for high frequencies and which presents an HF-power absorption capacity increasing as the frequency increases, wherein said circuit element is constituted by one or several subcircuits operated in a cascade, whereof each consists of an inductor on a first line section as well as a capacitor and a terminating resistor on a second line section, with said second line section branching off said first line section and being connected to ground while said first line section of a subcircuit is connected to the first line section of the subcircuit joining in the cascade, and wherein a quotient of a value of inductance and a value of capacitance of each of said one or several subcircuits corresponds to the square of effective impedance of said output line, and wherein the output line is galvanically connected to an input line of a second amplifier stage with further distributed HF-amplifier circuits, where a capacitively grounded compensative voltage is applied to common ports of active devices of the second amplifier stage.

* * * * *